US010340788B2

(12) United States Patent
Andersson et al.

(10) Patent No.: US 10,340,788 B2
(45) Date of Patent: Jul. 2, 2019

(54) POWER SOURCE INTERFACE MODULE WITH COMPACT EMI FILTER (71) Applicant: Telefonaktiebolaget LM Ericsson (publ), Stockholm (SE)

(72) Inventors: Mattias Andersson, Stockholm (SE); Martin Etsare, Saltsjö-Boo (SE); Per Ferm, Täby (SE); Roger Hoffström, Stockholm (SE); Igor Perez-Uria, Järfälla (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 64 days.

(21) Appl. No.: 15/536,846

(22) PCT Filed: Dec. 18, 2014

(86) PCT No.: PCT/SE2014/051531
§ 371 (c)(1),
(2) Date: Jun. 16, 2017

(87) PCT Pub. No.: WO2016/099355
PCT Pub. Date: Jun. 23, 2016

(65) Prior Publication Data
US 2017/0294835 A1 Oct. 12, 2017

(51) Int. Cl.
H02M 1/44 (2007.01)
H02M 1/12 (2006.01)
(Continued)

(52) U.S. Cl.
CPC ............... H02M 1/44 (2013.01); H02M 1/12 (2013.01); H02M 1/126 (2013.01); H03H 7/427 (2013.01);
(Continued)

(58) Field of Classification Search
CPC .......... H02M 1/44; H02M 1/12; H02M 1/126; H03H 7/427
(Continued)

(56) References Cited

U.S. PATENT DOCUMENTS 2,191,393 A * 2/1940 Humphreys ............ H01F 30/10
242/129
2008/0309431 A1 12/2008 Hui et al.

FOREIGN PATENT DOCUMENTS

WO 2004040599 A1 5/2004
WO 2016099355 A1 6/2016

OTHER PUBLICATIONS

Chen, Rengang, et al., "Planar Electromagnetic Integration Technologies for Integrated EMI Filters", 2003 IEEE, pp. 1582-1588.
(Continued)

Primary Examiner — Rakesh B Patel
(74) Attorney, Agent, or Firm — Boisbrun Hofman, PLLC (57) ABSTRACT The invention is directed towards a power source interface module for electronic circuits supplied by power from a power source as well as a power supply arrangement for electronic circuits comprising such a power source interface module. The module comprises a first circuit board carrying components, the first circuit board comprising a number of stacked circuit board layers as well as at least two openings, at least a part of a filter comprising at least one pair of magnetically coupled inductive coils, a core with two core legs, each core leg stretching through a corresponding opening in the circuit board, wherein each coil is wound around a corresponding core leg, the turns of the coils stretch through the circuit board layers, and each layer between an upper outer layer and a lower outer layer comprises at least a part of one turn.

19 Claims, 5 Drawing Sheets (51) Int. Cl.
*H03H 7/42* (2006.01)
*H02M 1/00* (2006.01)
*H01F 17/06* (2006.01)
*H03H 1/00* (2006.01)
*H05K 9/00* (2006.01)

(52) U.S. Cl.
CPC ............... *H01F 2017/065* (2013.01); *H02M 2001/0064* (2013.01); *H03H 2001/0035* (2013.01); *H05K 9/00* (2013.01); *H05K 2201/086* (2013.01)

(58) Field of Classification Search
USPC .................................. 333/181, 185; 336/200
See application file for complete search history.

(56) References Cited

OTHER PUBLICATIONS

PCT/SE2014/051531 International Search Report and Notification of Transmittal of International Search Report and The Written Opinion of the International Searching Authority, or the Declaration, dated Aug. 12, 2015, 9 Pages.

\* cited by examiner

POWER SOURCE INTERFACE MODULE WITH COMPACT EMI FILTER

CROSS-REFERENCE TO RELATED APPLICATION

This application is the National Stage of, and therefore claims the benefit of, International Application No. PCT/SE2014/051531 filed on Dec. 18, 2014, entitled "POWER SOURCE INTERFACE MODULE WITH COMPACT EMI FILTER", which was published in English under International Publication Number WO 2016/099355 on Jun. 23, 2016. The above application is commonly assigned with this National Stage application and is incorporated herein by reference in its entirety.

TECHNICAL FIELD

The invention generally relates to filtering in relation to power supplies. More particularly, the invention relates to a power source interface module for electronic circuits supplied by power from a power source as well as to a power supply arrangement for electronic circuits comprising such a power source interface module.

BACKGROUND

Electromagnetic interference (EMI) filters are required in various situations, such as in relation to power supply of electronic circuits like electronic circuits on circuit boards or circuit blades, for instance for powering telecommunication or data communication circuits.

Such boards or blades are then typically powered from a system voltage, for instance 48V DC. Because of this they may also require EMI filtering on their power inputs in order to pass conducted emission requirements.

The conducted emission may for instance be measured according to CISPR 22 or some similar standard. The requirement on a board or blade can be according to Class A for enterprise products or Class B for consumer products or any other level determined by a system designer. The noise that needs to be filtered then typically stems from one or more DC/DC converters.

An EMI filter can either be realized as a discrete design or in the form of a module containing the filter.

However, there is a problem in that the power consumption of the boards or blades increase and with this the size of the EMI-filter. Board space and building height is, however, limited. It would therefore be advantageous if the power level could increase without requiring more board space for the EMI-filter.

Furthermore, in these filters there is used a pair of magnetically coupled coils operating as common mode chokes. The traditional way of realizing these coils is through toroid chokes.

However, commonly available toroid chokes grow big in comparison with other circuits on the board or blade when currents exceed 10A.

In order to reduce the size of EMI-filters, investigations have been made directed towards making the windings planar.

One document in this field is US 2008/0309431, which is directed towards an EMI filter comprising a pair of opposed coreless spiral planar windings and a planar capacitor in order to integrate common mode and differential mode filters into integrated planar structures.

Another document describing planar windings in EMI filters is "Planar Electromagnetic Integration Technologies for Integrated EMI Filters", by Rengang Chen, J. D. van Wyk, S. Wang and W. G. Odendaal, 38th IAS Annual Meeting. Conference Record of the Industry Applications Conference, 2003, October 2003, page(s): 1582-1588.Vol 3.

However, there is still a need for further measures that allow further improvements and size reductions.

SUMMARY

One object of the invention is therefore to provide a power source interface module that has a filter being small in size.

This object is according to a first aspect achieved by a power source interface module for electronic circuits supplied by power from a power source. The power source interface module comprises a first circuit board carrying components, the first circuit board comprising a number of stacked circuit board layers as well as at least two openings, at least a part of a filter comprising at least one pair of magnetically coupled inductive coils, and a core with two core legs, each core leg stretching through a corresponding opening in the circuit board.

Each coil is wound around a corresponding core leg,
the turns of the coils stretch through the circuit board layers, and
each layer between an upper outer layer and a lower outer layer comprises at least a part of one turn.

Another aspect is concerned with a power supply arrangement for electronic circuits, the power supply arrangement comprising a power source interface module according to the first aspect and at least one power supply unit for the electronic circuits.

The invention according to the above-mentioned aspects has a number of advantages. It reduces the size of the power source interface module and then typically the height using a small enough core for the common mode coils having a required number of turns of the coils.

According to a first variation, a whole turn of a coil is provided via two layers. According to a second variation a whole turn of a coil is provided via one layer.

According to a third variation, the two legs are interconnected by an upper and a lower yoke, each yoke comprising a wing stretching out in a direction away from the two legs. In this case each leg may have a central longitudinal axis stretching through the centre and each yoke with wing has a central longitudinal axis that is perpendicular to both the leg axes. This together with the separation of the core legs in two has the advantage of increasing the leakage inductance, which improves differential mode filtering According to another variation, each leg is divided in two halves, where each half has an interface surface abutting the other interface surface. This simplifies mounting of the core on a circuit board.

According to another variation, the interface surfaces are polished. This improves the magnetic flux within the core leg.

The interface surfaces may be joined to each other using zero-gap glue. Alternatively they may be joined to each other using a clip. Both are advantageous in that no material is added between the interface surfaces.

Each leg may also have an oblong cross-section, which provides a more economical circuit board design as compared with a circular shape.

At least one capacitor of the filter may furthermore be mounted on the first circuit board, and with advantage on an area of the circuit board comprising a coil. This further improves the compactness of the module.

The filter may be connected to a power supply unit for supplying power to the electronic circuits and may additionally comprise a second circuit board connected to the first circuit board via a set of conductors. In this case the first circuit board may comprise the main power train between the power source and the power supply unit.

The components on the first circuit board may comprise one or more of input OR'ing, hotswap, active hold-up, management power and control components.

Furthermore, a first stage of the power management may be provided on the second circuit board, while a second stage of the power management may be provided on the first circuit board.

The second circuit board may in turn comprise signalling and auxiliary power supply components.

The coils may with advantage be common mode chokes and the filter a filter for filtering electromagnetic interference.

The first circuit board may be an auxiliary circuit board provided in addition to a main circuit board comprising the electronic circuits that are supplied with power. Alternatively the first circuit board may be such a main circuit board.

It should be emphasized that the term "comprises/comprising" when used in this specification is taken to specify the presence of stated features, or components, but does not preclude the presence or addition of one or more other features, components or groups thereof.

BRIEF DESCRIPTION OF THE DRAWINGS

The invention will now be described in more detail in relation to the enclosed drawings, in which.

DETAILED DESCRIPTION

In the following description, for purposes of explanation and not limitation, specific details are set forth such as particular architectures, interfaces, techniques, etc. in order to provide a thorough understanding of the invention. However, it will be apparent to those skilled in the art that the invention may be practiced in other embodiments that depart from these specific details. In other instances, detailed descriptions of well-known devices, circuits and methods are omitted so as not to obscure the description of the invention with unnecessary detail.

Figure 1:
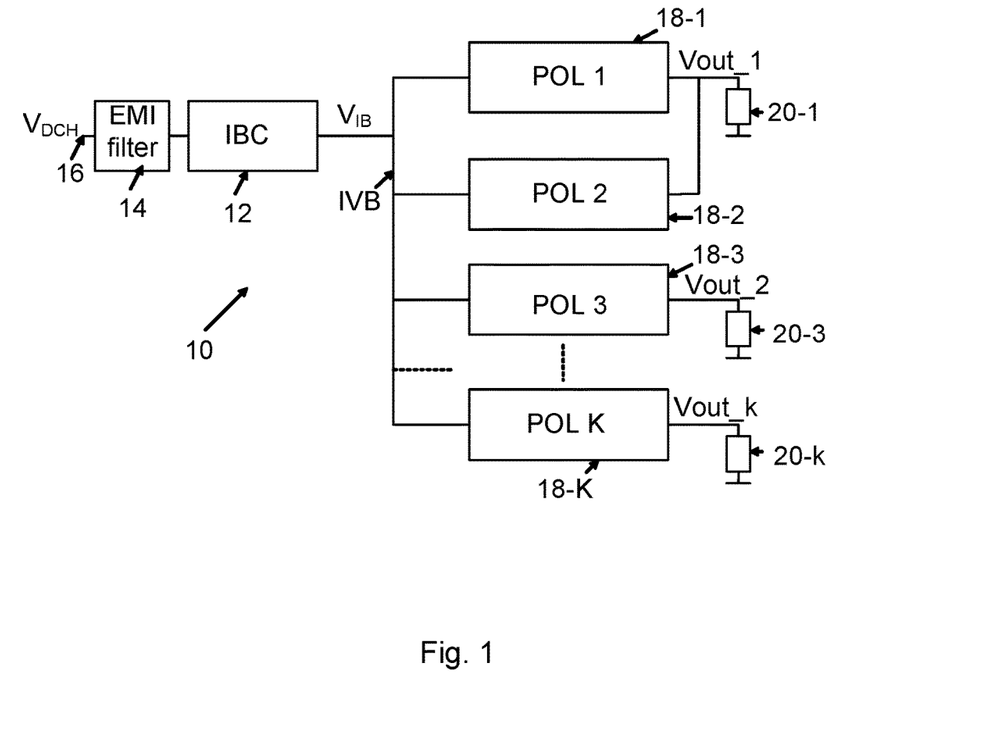
FIG. 1 schematically shows a power supply arrangement for a circuit board or a circuit blade comprising an EMI filter, various converters and connected to loads.

FIG. 1 schematically shows a power supply arrangement 10 that may be provided for powering electronic circuits, such as the electronic circuits provided on a circuit board or a circuit blade, for instance in relation to data communication or telecommunication.

The power supply arrangement 10 is here exemplified by the non-limiting example of an Intermediate Bus Architecture (IBA) power supply, which may provide a number of tightly-regulated voltages from an input power source via a two-stage voltage conversion arrangement. An IBA power supply arrangement is merely one example of a number of different types of power supply arrangements in which aspects of the invention may be implemented.

As mentioned above, the exemplifying IBA power supply arrangement 10 is a two-stage power distribution network. Therefore it comprises a first stage DC/DC converter 12 connected to an input power bus 16 via an electromagnetic interference (EMI) filter 14. The input power bus 16 is typically a power source providing a voltage $V_{DCH}$ between 36-75 V, 18-36 V or 18-60 V. The first stage DC/DC converter 12 is connected via the Intermediate Voltage Bus (IVB) to the inputs of a number (K) of second stage DC/DC converters 18-1 to 18-K.

The first stage DC/DC converter 12, commonly referred to as an Intermediate Bus Converter (IBC), may be an isolated DC/DC converter. An IBA power supply having such a first stage DC/DC converter 12 has the advantage of being more efficient and more cost-effective to manufacture by reason of the isolation from the input power bus, which generally requires the use of relatively costly components including a transformer, being provided at a single converter. Naturally, the IBC 12 may alternatively be non-isolated from the input power bus 16. The IBC 12 may be implemented in the form of a switched mode power supply (SMPS), which may be fully regulated or line regulated to convert the input power bus voltage $V_{DCH}$ to a lower intermediate bus voltage $V_{IB}$ on the IVB.

In the example of FIG. 1, each of the plurality of second stage DC/DC converters 18-1 to 18-K may be a non-isolated buck regulator commonly referred to as a Point-of-Load (POL) converter or regulator. In general, each of the second stage DC/DC converters may be isolated or non-isolated. However, where isolation is provided by the IBC 12, there is no requirement that also the POL regulators are isolated. A second stage DC/DC converter may take the form of an SMPS or a non-switched linearly-regulated Low Drop Out (LDO) regulator. Each POL (k) delivers a regulated voltage Vout_k to its load 20-k, where a load may comprise one or more of the electronic circuits of the circuit board or circuit blade. In the example of FIG. 1, POL regulators 18-1 and 18-2 deliver power to a common load 20-1 (although, naturally, more than two POL regulators may deliver power to a common load).

The IBC 12 is here a power supply unit for supplying power to the electronic circuits on the circuit boards or circuit blades, i.e. the loads, It cannot enough be stressed that the power supply arrangement is merely an exemplifying arrangement. Other types of arrangements, for instance arrangements connected to AC sources may equally as well be considered for combining with the filter.

However, independently of how the power supply arrangement is realized, it always comprises an EMI filter 14 in order to meet certain emission requirements placed on the circuit board or circuit blade.

Figure 2:
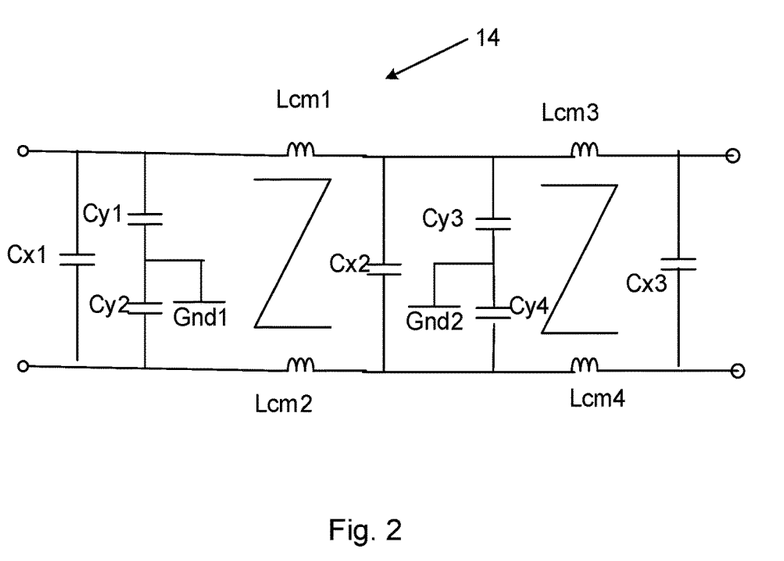
FIG. 2 shows a circuit diagram of an exemplifying EMI filter.

FIG. 2 shows a circuit diagram of an exemplifying EMI filter 12.

The EMI filter may comprise an input port having a first and a second connection terminal, and across the input port, i.e. between the two input terminals, there is connected a first differential mode capacitor Cx1. Between the two input terminals there is a series-connection of a first and second common mode capacitor Cy1 and Cy2, where the junction or midpoint between the common mode capacitors Cy1 and Cy2 is connected to a first grounding point Gnd1. The first connection terminal of the input port is furthermore connected to a first output terminal of an output port via a first upper conductor and the second connection terminal of the input port is connected to a second output terminal of the output port via a second lower conductor. In the upper conductor there is a first inductive common mode coil Lcm1 and in the lower conductor there is second inductive common mode coil Lcm2. The two common mode coils Lcm1 and Lcm2 are here magnetically coupled to each other via a magnetic core, such as an iron core. After the two common mode coils Lcm1 and Lcm2 follows a second differential mode capacitor Cx2 connected between the first upper and second lower conductor. After the second differential mode capacitor Cx2 follows a series-connection of a third and fourth common mode capacitor Cy3 and Cy4 between the two conductors, where also here the midpoint or junction between them is connected to a second grounding point Gnd2. The two grounding points may thus be separate from each other. As an alternative it is possible that a common grounding point is used. Thereafter follows a third inductive common mode coil Lcm3 in the first upper conductor and a fourth inductive common mode coil Lcm 4 in the second lower conductor. Also here the two common mode coils Lcm3 and Lcm4 are magnetically coupled to each other via a magnetic core, such as an iron core. Thereafter follows a third differential mode capacitor Cx3 connected between the two conductors. Finally the first upper conductor is connected to the first connection terminal of the output port and the second lower conductor is connected to the second connection terminal of the output port.

It should here be realized that it is possible to change the filter. It may be possible to omit the differential mode capacitors. It is also possible to add differential mode coils in the upper and lower conductors. It is also possible to omit the third and fourth common mode coils Lcm3 and Lcm4 as well as the corresponding capacitors Cy3 and Cy4. It should also be realized that it is possible to add further components to the filter. Such additional components can furthermore be provided in proximity of the IBC 12. It is also possible to change the position of the components in the filter.

According to some variations, the common mode coils also are used together with the corresponding cores to provide differential mode inductances. The differential mode inductances are in this case obtained through the use of leak inductances.

As described earlier, a circuit board or a circuit blade for telecommunication or data communication comprising components do in many cases become more and more complex and have a requirement to include more and more functions. This in turn leads to the EMI filter having to have larger components. Furthermore various functions associated with the filter or power supply, such as functions associated with DC/DC conversion, are typically provided as a power supply interface module on one or more auxiliary circuit boards, where a power supply interface module is a module that is provided as an interface to the power source, which power source in the example above provides the voltage $V_{DCH}$.

Traditionally the common mode coils have been provided through a number of turns of copper wound around a toroid shape core. However, this is in many cases a realization that is too space consuming.

In order to reduce the size and then typically the height of such a module it is advantageous if at least some of the filter components, such as the coils can be made a part of the auxiliary circuit board of the power supply interface module. Such an auxiliary circuit board may be provided for various converter functions, such as for various functions associated with a DC/DC converter, such as IBC 12. However, when this is done, there is still a question of how to provide a small enough core needed for the common mode coils together with the provision of a required number of turns of the coils.

It is a challenge to obtain such a realization that is small in size. There is therefore a need to reduce the size of the filter even further.

As mentioned above, the filter is a part of the power supply interface module, which module also comprises the above-mentioned auxiliary circuit board and optionally also some of the functions associated with the interaction of IBC 12 with the power source.

Figure 3:
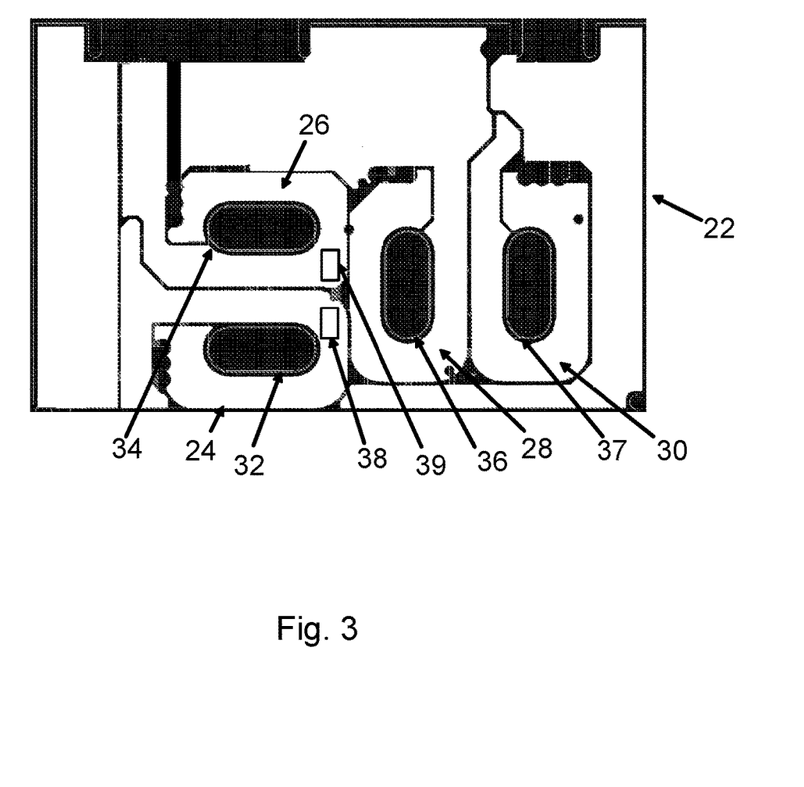
FIG. 3 shows a plan view of a circuit board of a power source interface module comprising the EMI filter.

FIG. 3 shows a plan view from above of a first auxiliary circuit board 22 of the power source interface module. The first auxiliary circuit board 22, which comprises a number of layers, such as ten or twelve layers stacked on each other, comprises a number of pads or spots where components can be mounted as well as conductor traces interconnecting such spots. In the figure two such spots 38 and 39 are schematically indicated. However, the first circuit board 22 also comprises a number of planar loops of electrically conducting material, such as copper, where each loop encircles a corresponding through-hole in the first circuit board 22. There are in the example of FIG. 3 four such planar loops, 24, 26, 28 and 30. There is a first loop 24 at an edge of the first circuit board 22 and a second loop 26 adjacent the first loop 24. The first loop 24 encircles a first through-hole 32, while the second loop 26 encircles a second through-hole 34. There is also a third loop 28 and a fourth loop 30 adjacent each other, where the third loop 28 encircles a third through-hole 36, while the fourth loop 30 encircles a fourth through-hole 38. Furthermore the loops shown in this way are loops in a layer immediately below the upper outer layer of the circuit board 22. The layers between this penultimate layer and the lower outermost layer also comprise loops of the same shape being aligned with these loops in the penultimate layer. In this way there is provided a number of loops stacked upon and aligned with each other through the circuit board layers.

Furthermore, the first loop 24 is a part of the first common mode coil Lcm1 and the second loop 26 is a part of the second common mode coil Lcm2 of the filter, or vice versa. One or more of the loops in the stack comprising the first loop 26 may thus comprise the first differential mode coil and one or more of the loops in the stack comprising the second loop may comprise the second differential mode coil. The loops in a stack are thus galvanically connected to each, for instance through the use of vias, in order to form a number of turns of a coil. The third and fourth loops 28 and 30 in a similar way provide the third and fourth common mode coils Lcm3 and Lcm4.

This means that each loop in a stack of loops makes up at least a part of a turn of the coil. It is possible that one loop forms a turn by itself. It is also possible that two or more loops in two or more layers, for instance in two or more adjacent layers, form a turn of the coil. If there is for instance twelve layers it is then possible that five turns of the coils are provided through the loops. Put differently, the turns of the coils stretch through the circuit board layers, and each layer between the upper outer layer and a lower outer layer comprises at least a part of one turn, where a whole turn may be provided via two layers or via one layer. The turns of the common mode coils may furthermore be placed in several layers to achieve the needed number of turns and a sufficient copper thickness to carry the current.

The component spots 38 and 39 on top of the first and second loops are here provided for the common mode capacitors Cy1, Cy2, Cy3 and Cy4 of the filter. The filter thus comprises at least one capacitor mounted on the first circuit board 22, which capacitor is mounted on an area of the circuit board comprising a coil. The first and second common and differential mode capacitors may with advantage be mounted on the first and/or second coils, while the third and fourth common and differential mode capacitors may be mounted on the third and fourth coils. The common and differential mode capacitors may furthermore be surface mounted and fitted on both sides of the circuit board.

It can here be seen that the holes encircled by the coils have an oblong shape. The holes have a shape that is adapted for receiving a corresponding leg of a core, where one core with two legs is provided for the first and second common mode coils and another core with two legs is provided for the third and fourth common mode coils.

Figure 4:
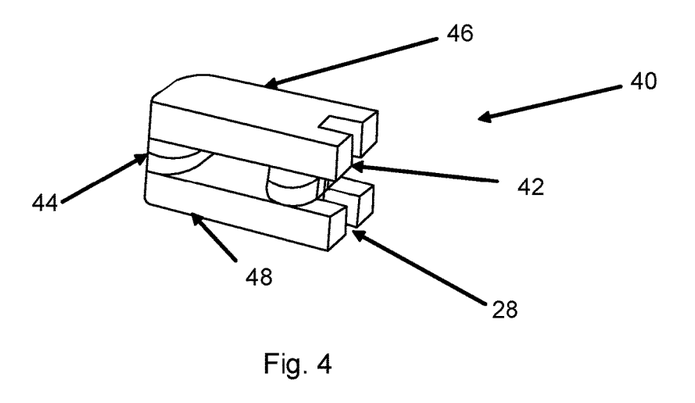
FIG. 4 shows a perspective view of a core for two coils of the EMI filter.
Figure 5:
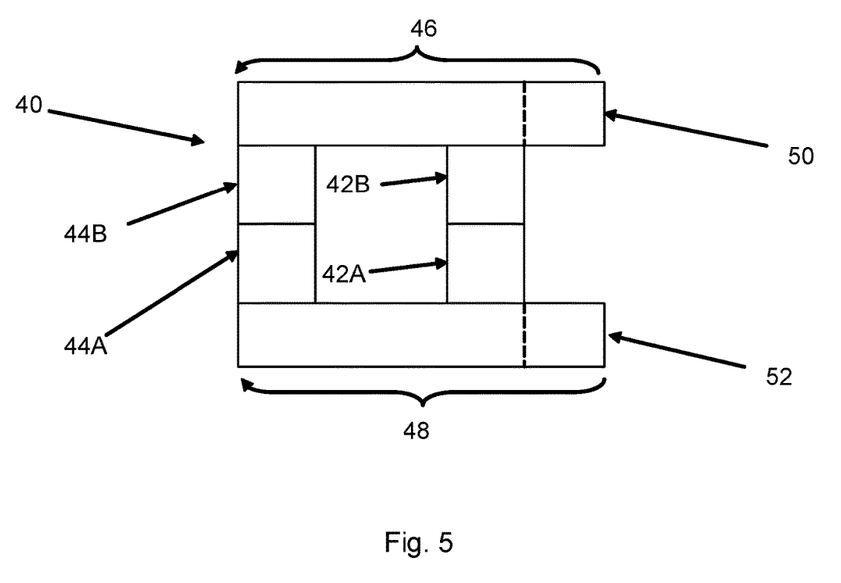
FIG. 5 shows a side view of a core for two coils of the EMI filter.

FIG. 4 shows a perspective view of one way of realising a core for the first and second common mode coils and FIG. 5 a side view of the same core.

As described earlier the core 40 comprises a first and a second leg 42 and 44, each with a cross-section with a shape that is the same as the shape of the hole, where each core leg is supposed to stretch through a corresponding opening in the circuit board so that the correspond coil is wound around it. Each coil is thus wound around a corresponding core leg. It can thereby be seen that also the core leg cross-section is oblong. Furthermore each leg is joined with an upper and a lower yoke 46 and 48, where the lower yoke 48 is to rest on the back side of the circuit board and the upper yoke 46 is to rest on the front side of the circuit board. Thereby the two legs are interconnected by the upper and lower yokes 46 and 48. Each leg 42 and 44 furthermore has a central longitudinal axis and each yoke 46 and 48 has a central longitudinal axis that is perpendicular to both the leg axes.

It can be seen that the first and second yokes 46 and 48 are aligned with the second leg 44. They are thus aligned with the side of the second leg in a direction away from the first leg. However in the area of the first leg 42, each is provided with a wing 50 and 52, which stretches out beyond the side of the first leg 42 in a direction away for instance perpendicularly away from both the legs 42 and 44 and along the longitudinal axis of the yoke. By providing two legs in this way instead of one and adding the wings, the leakage inductance can be increased. The leakage inductance of the common mode choke provides differential mode filtering which is advantageous in an EMI-filter.

The wings thus provide a differential mode leakage inductance, which is used as a part of the filter. This is equivalent to each common mode coil wound around such a core being connected in series with a corresponding differential mode inductance.

Furthermore in order to be able to mount the core on the first circuit board 22, the two legs are split into two halves 42A, 42B, 44A and 44B. Thereby each core leg half 42A, 42B, 44A and 44B will have an interface surface that is to mate with the interface surface of the other half.

In order to improve the magnetic flux within the core leg, these surfaces may be polished and in order to attach these surfaces to each other while at the same time retaining a good magnetic flux, they may be joined to each other using zero-gap glue. A zero-gap glue will enter into cracks of the core material and will thereby joint the surfaces to each other while retaining a good flux, even though the leg has been split. As an alternative to a zero-gap glue it is possible to force the interface surfaces of a core against each other using a clip.

As mentioned earlier, the interface module may comprise a number of further components performing further functionality in relation to the power supply of the circuit boards or circuit blades. There may for this reason be provided a second circuit board connected to the first circuit board using one or two sets of flexible conductors.

Figure 6:
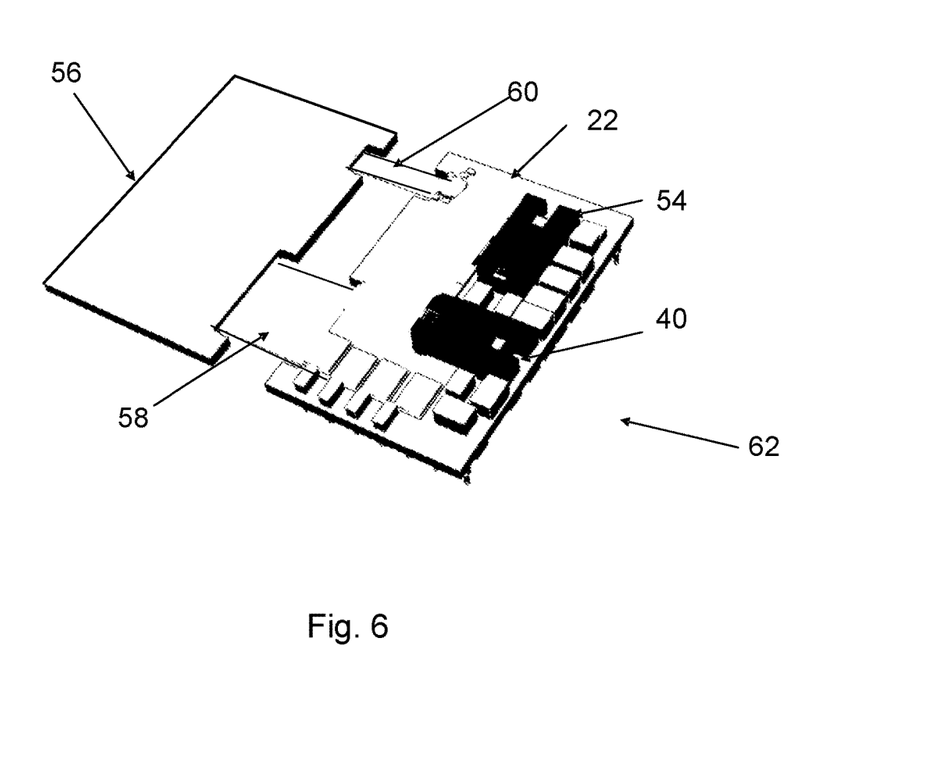
FIG. 6 shows the power source interface module when being provided with two communicatively interconnected circuit boards and adapted for folding one of the circuit boards on top of the other.

FIG. 6 show a perspective view of an interface module 62 comprising two such circuit boards 22 and 56 interconnected by a first and second set of conductors 58 and 60. Each set 58 and 60, which includes a number of conductors, may be realized in the form of flex film, which allows one of the circuit boards to be folded on top of the other. It can also be seen that two cores 40 and 54 with upper yokes are placed on the first circuit board for the four coils.

In FIG. 6, the first circuit board comprises the main power train between the power source which supplies the voltage $V_{DCH}$ and the power supply unit 12. It may therefore comprise input OR'ing, hotswap, active hold-up, management power, monitoring and control components as well as PMBus communication. Consequently the second circuit board 56 may comprise signalling and auxiliary power supply components. It is furthermore possible that a first stage of the power management is provided on the second circuit board, while a second stage of the power management is provided on the first circuit board. Therefore the rigid flex cable may be integral to the circuit boards and carry signals and auxiliary power but not the main current.

Embodiments of the invention is a compact EMI filter comprising a first auxiliary circuit board, such as a printed circuit board, with integrated planar common mode coils and X and Y capacitors. The capacitors are preferably surface mounted and fitted on both sides of the circuit board.

With the windings of the common mode coil not present on the outer layers of the printed circuit board the capacitors can be placed on top of the windings.

The interface module thereby allows more power be handled without using more board space on the main circuit board or circuit blade.

As compared with a surface mounted toroid solution, less board space is effectively used on the module. In addition to this there is a lowering of the building height.

In addition the two common mode coils are wound around different legs of the magnetic core. This allows the number of turns to be doubled compared with if both coils are to be stacked upon each other in the circuit board layers. Thereby also the height of the core can be reduced. The shape of the magnetic core with two legs with wings on the yokes has the additional advantage of increasing the leakage inductance. The oblong shaped hole and core leg cross-section has the further advantage of providing a more economical circuit board design as compared with a circular shape.

In the description made above, the power source interface module was described as a module with an auxiliary circuit board provided in relation to a main circuit board or circuit blade, such as a separate module on such a main board or blade. It should however be realized that the first circuit board of the power interface module may in some variations be such a main circuit board or circuit blade, in which case the various elements of the power interface module would also be provided on this main circuit board or circuit blade.

While the invention has been described in connection with what is presently considered to be most practical and preferred embodiments, it is to be understood that the invention is not to be limited to the disclosed embodiments, but on the contrary, is intended to cover various modifications and equivalent arrangements. Therefore the invention is only to be limited by the following claims.

The invention claimed is:

1. A power source interface module for electronic circuits supplied by power from a power source, comprising:
    a first-circuit board carrying components and comprising a number of stacked circuit board layers as well as at least two openings,
    a filter comprising at least one pair of magnetically coupled inductive coils, and
    a core with two core legs, each core leg stretching through a corresponding opening in the first circuit board, wherein each magnetically coupled inductive coil is wound around a corresponding core leg, turns of the magnetically coupled inductive coils stretch through the stacked circuit board layers, and each layer between an upper outer layer and a lower outer layer of the stacked circuit board layers comprises at least a part of one turn, wherein the two core legs are interconnected by an upper yoke and a lower yoke, each yoke comprising a wing stretching out in a direction away from the two core legs.

2. The power source interface module according to claim 1, wherein a whole turn is provided via the stacked circuit board layers.

3. The power source interface module according to claim 1, wherein the first circuit board is an auxiliary circuit board provided in addition to a main circuit board comprising the electronic circuits.

4. The power source interface module according to claim 1, wherein the first circuit board is a main circuit board comprising the electronic circuits.

5. The power source interface module according to claim 1, wherein each core leg has a central longitudinal axis stretching through a respective center of each core leg and each yoke with the wing has a central longitudinal axis that is perpendicular to the central longitudinal axis of each core leg.

6. The power source interface module according to claim 1, wherein each core leg is divided into two halves, each half having an interface surface abutting another interface surface.

7. The power source interface module according to claim 1, wherein the filter further comprises at least one capacitor mounted on the first circuit board.

8. The power source interface module according to claim 7, wherein the capacitor is mounted on an area of the first circuit board comprising at least one of the magnetically coupled inductive coils.

9. The power source interface module according to claim 1, wherein the magnetically coupled inductive coils are common mode chokes.

10. The power source interface module according to claim 1, wherein each core leg has an oblong cross-section.

11. The power source interface module according to claim 1, wherein the filter is connected to a power supply unit for supplying power to the electronic circuits and further comprising a second circuit board connected to the first circuit board via a set of conductors, wherein the first circuit board comprises a main power train between the power source and the power supply unit.

12. The power source interface module according to claim 11, wherein the second circuit board comprises signalling and auxiliary power supply components.

13. The power source interface module according to claim 11, wherein the components on the first circuit board comprise one or more of input OR' ing, hotswap, active hold-up, power management and control components.

14. The power source interface module according to claim 13, wherein a first stage of the power management and control components are provided on the second circuit board, and a second stage of the power management and control components are provided on the first circuit board.

15. A power supply arrangement for electronic circuits, comprising:
    a power source interface, comprising:
        a first-circuit board carrying components and comprising a number of stacked circuit board layers as well as at least two openings,
        a filter comprising at least one pair of magnetically coupled inductive coils, and
        a core with two core legs, each core leg stretching through a corresponding opening in the first circuit board, wherein each magnetically coupled inductive coil is wound around a corresponding core leg, turns of the magnetically coupled inductive coils stretch through the stacked circuit board layers, and each layer between an upper outer layer and a lower outer layer of the stacked circuit board layers comprises at least a part of one turn; and
    a power supply unit for supplying power to the electronic circuits and comprising a second circuit board connected to the first circuit board via a set of conductors, wherein the first circuit board comprises a main power train between a power source and the power supply unit.

16. The power supply arrangement according to claim 15, wherein the two core legs are interconnected by an upper yoke and a lower yoke, each yoke comprising a wing stretching out in a direction away from the two core legs.

17. The power supply arrangement according to claim 16, wherein each core leg has a central longitudinal axis stretching through a respective center of each core leg and each yoke with the wing has a central longitudinal axis that is perpendicular to the central longitudinal axis of each core leg.

18. The power supply arrangement according to claim 15, wherein the filter further comprises at least one capacitor mounted on an area of the first circuit board comprising at least one of the magnetically coupled inductive coils.

19. The power supply arrangement according to claim 15, wherein a first stage of power management and control components are provided on the second circuit board and a second stage of the power management and control components are provided on the first circuit board.

* * * * *